United States Patent [19]

Kitakohji et al.

[11] Patent Number: 4,600,685
[45] Date of Patent: Jul. 15, 1986

[54] PATTERNING PROCESS USING LADDER-TYPE ORGANOSILOXANE RESIN AND PROCESS FOR PRODUCTION OF ELECTRONIC DEVICES UTILIZING SAID PATTERNING PROCESS

[75] Inventors: Toshisuke Kitakohji, Machida; Shiro Takeda, Sagamihara; Minoru Nakajima, Kawasaki; Hiroshi Tokunaga, Yokohama, all of Japan

[73] Assignee: Fujitsu Limited, Kawasaki, Japan

[21] Appl. No.: 738,891

[22] Filed: May 29, 1985

Related U.S. Application Data

[63] Continuation of Ser. No. 545,601, Oct. 27, 1983, abandoned, which is a continuation of Ser. No. 305,784, Sep. 25, 1981, abandoned.

[30] Foreign Application Priority Data

Sep. 27, 1980 [JP] Japan .................. 55-134542

[51] Int. Cl.$^4$ ............................................. G03C 5/00
[52] U.S. Cl. .................................... 430/313; 430/270; 430/272; 430/296; 430/314; 430/325; 430/330
[58] Field of Search ............... 430/270, 272, 296, 313, 430/314, 325, 330

[56] References Cited

U.S. PATENT DOCUMENTS 4,041,190  3/1977  Debois et al. ................ 430/296
4,349,609  9/1982  Takeda et al. ................ 428/429

OTHER PUBLICATIONS

Debois et al., Electron and Ion Beam Science and Technology, Fifth International Conference (1972).
Takeda et al, Ladder-Organosiloxane Polymer as an Insulation Layer, extended abstracts, vol. 80-2, Oct. 1980.

*Primary Examiner*—Jack P. Brammer

[57] ABSTRACT

A patterning process is provided wherein a material to be etched is coated with a ladder type organosiloxane resin, the coated resin is irradiated with energy rays according to a desired pattern, the irradiated resin is subjected to a development treatment, and then, the material is etched by using the resin left after the development as a mask. The ladder type organosiloxane resin used is represented by the formula:

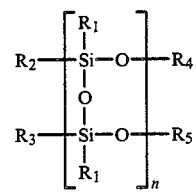

wherein each $R_1$ is independently selected from alkyl (C1-6) groups, and phenyl and halophenyl groups, $R_2$, $R_3$, $R_4$ and $R_5$ are independently selected from hydrogen, alkoxy (C1-3) groups, a hydroxyl group and alkyl (C1-3) groups, and n is a number giving a Mw of about 1,000 to about 1,000,000. The patterning process can be advantageously employed for the production of electronic devices.

15 Claims, 14 Drawing Figures

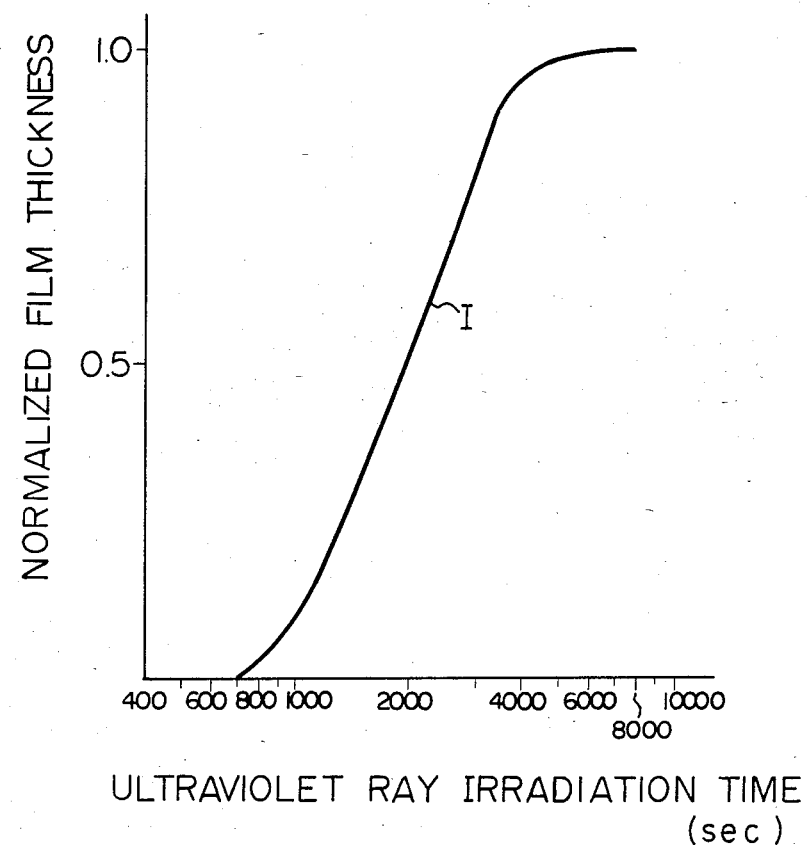

PATTERNING PROCESS USING LADDER-TYPE ORGANOSILOXANE RESIN AND PROCESS FOR PRODUCTION OF ELECTRONIC DEVICES UTILIZING SAID PATTERNING PROCESS

This is a continuation of co-pending application Ser. No. 545,601 filed on Oct. 27, 1983 now abandoned, which itself is a continuation of Ser. No. 305,784 filed Sept. 25, 1981 now abandoned.

BACKGROUND OF THE INVENTION

This invention relates to a patterning process using a specific energy-sensitive ladder type organo-siloxane resin and a process for producing electronic devices by utilizing this patterning process. The ladder type organosiloxane resin used in this invention has such a specific property that when it is irradiated with energy rays such as light rays, X-rays, electron beams and ion beams, it is rendered insoluble in a specific solvent, and a film of the insolubilized resin has a high insulating property and heat resistance. Accordingly, after this resin has been used as a material to be etched in the lithographic process, the resin can be used as an insulating layer as it is or after it is heat-treated.

Among polymeric compounds, there are presently resin compositions having such a specific property that when they are irradiated with visible rays, ultraviolet rays, X-rays, electron beams, ion beams and the like, polymerization or decomposition occurs to render them insoluble or soluble in specific solvents. It is well-known that the lithographic process comprising selectively irradiating a thin layer formed of such a resin composition (hereinafter referred to as "resist") with energy rays and selectively dissolving the soluble portion alone in a specific solvent to form a desired pattern is used for the production of semiconductor devices and the like. However, known resists are ordinarily poor in heat resistance and are not completely chemically stable, and furthermore, they are not sufficiently satisfactory as insulating materials. Therefore, there is ordinarily adopted a method in which a pattern formed of such a resist is used as a mask for etching an insulating or conductive material located below the mask of the resist and the resist is removed after completion of the etching operation. In other words, the resist is necessary only as a masking material for the selective etching step and it is not a material to be left as a part of the final product. Accordingly, there would be great advantages in a resist which is excellent in heat resistance and in its insulating property, and if a resist layer, formed by selectively irradiating this resist with energy rays and selectively removing the resist to form a disired pattern, could be used as an insulating layer as it is or after it is subjected to an additional simple treatment. These advantages will be especially prominent in the process for the production of semiconductor devices wherein the etching step is repeated many times, because the process steps are remarkably simplified.

J. C. DuBois et al., in "Polyvinyl Siloxane (PVS), A Highly Sensitive Electron-Beam Resist", Electron and Ion Beam Science and Technology, Fifth International Conference, pages 112–122 (1972), disclose an electron beam-sensitive resist comprising a ladder type organosiloxane resin. The ladder type organosiloxane disclosed has a vinyl group ($CH_2=CH-$) on the side chain and has a relatively low molecular weight. Accordingly, it is considered that this resist is not a highly heat-resistant resist as intended by this invention. The above reference does not teach a process for producing an electronic device by utilizing the above ladder type organosiloxane resin. Although the reference teaches that a resist of the above resin is heated to convert it to an inorganic silica compound, the reference does not suggest at all that the resist will be left as a heat-resistant insulating layer.

SUMMARY OF THE INVENTION

It is a primary object of this invention to provide a lithographic process in which the patterning treatment is carried out by utilizing a specific ladder type organosiloxane resin which has a good heat resistance and insulating property, and which futher has such a property that, after it has been used as a resist, it can function as an insulating layer as it is or after it is subjected to a simple additional treatment such as a heat treatment.

Another object of this invention is to provide a process for advantageously producing an electronic device with an insulating layer having a high heat resistance by utilizing the above-mentioned lithographic process.

Other objects and advantages of this invention will be apparent from the following detailed description.

In accordance with one fundamental aspect of this invention, there is provided a patterning process comprising coating a material to be subjected to etching, with a ladder type organosiloxane resin represented by the following general formula [I]:

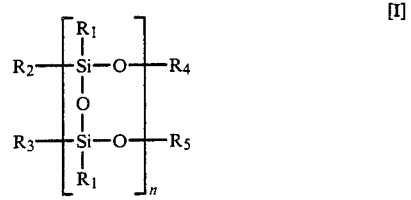

wherein the $R_1$'s, which may be the same or different from each other, stand for at least one member selected from alkyl groups having 1 to 6 carbon atoms, and phenyl and halophenyl groups, $R_2$, $R_3$, $R_4$ and $R_5$, which may be the same or different, are selected from hydrogen, alkoxy groups having 1 to 3 carbon atoms, a hydroxyl group and alkyl groups having 1 to 3 carbon atoms, and n is a number giving a weight average molecular weight of about 1,000 to about 1,000,000 to the ladder type organosiloxane resin represented by the general formula [I];
irradiating the organosiloxane resin with energy rays according to a desired pattern; subjecting the resin-coated material to a development treatment; and then, etching the material by using the resin left after the development as a mask.

In accordance with another fundamental aspect of this invention, there is provided a process for producing an electronic device, which comprises forming a layer of a ladder type organosiloxane resin represented by the above general formula [I] on a lower wiring layer formed on a substrate; subjecting the resin layer to selective irradiation with energy rays and to a development treatment to form layer-connecting through-holes in the resin layer; and then, forming an upper wiring layer in said through-holes so that the upper wiring layer is connected to the lower wiring layer and extends onto the surface of the organosiloxane resin layer.

BRIEF DESCRIPTION OF THE DRAWINGS

FIG. 6 is a curve illustrating the relation between the normalized thickness of the ladder type organosiloxane resin used in Example 5 and the irradiation time of ultraviolet rays;

DETAILED DESCRIPTION OF THE PREFERRED EMBODIMENTS

Figure 1:
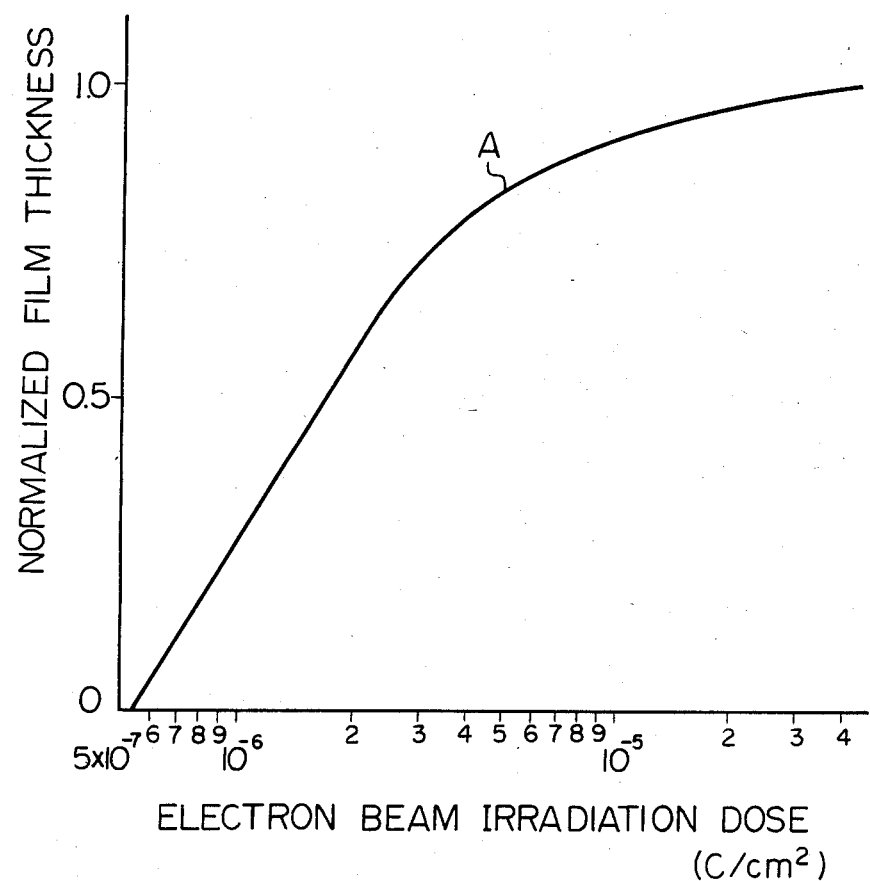
FIG. 1 is a curve illustrating the relation between the normalized thickness of the ladder type organosiloxane resin used in Example 1 and the irradiation dose of an electron beam.

Characteristic properties of ladder type organosiloxane resins of the general formula [I] used in this invention and processes of this invention utilizing these resins will now be described in detail.

Lithographic resin compositions are ordinarily sensitive to energy rays such as electromagnetic waves and particle rays or contain sensitizers to these energy rays. This indicates that materials having a resist property are ordinarily poor in heat resistance. For example, the highest applicable temperature of a novolak type resist often used as the photoresist is about 150° C. and the glass transition temperature of polymethyl methacrylate (PMMA) as a typical example of an electron beam resist is 105° C. Furthermore, it is natural to expect to observe a tendency that the higher is the sensitivity of the resist, the poorer is the heat resistance of the resist.

The ladder type organosiloxane resin of the above general formula [I] used in this invention has a heat resistance of at least 300° C. More specifically, the organosiloxane resin should not undergo heat distortion at a temperature higher than 300° C. and should maintain a good adhesion to a substrate to be coated therewith and to a top layer to be superposed thereon at such high temperature, and for example, the characteristics of the resin should not be changed at all even when the resin is allowed to stand in steam maintained at 120° C. and 2 atmospheres for scores of hours.

For example, a polymethylsilsesquioxane (having a weight average molecular weight of 37,000) represented by the following formula [II]:

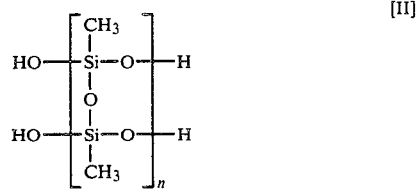

was irradiated with electron beams through a mask having a line pattern with a line spacing of 2 μm and was then developed with xylene for about 1 minute. The resulting resist layer with a line pattern having a line spacing of 2 μm was exposed to a nitrogen atmosphere maintained at 450° C. for 1 hour and then, the pattern precision was examined. The electron beam-irradiated polymethyl-silsesquioxane was not influenced by the temperature of 450° C., and it was confirmed that this resin has an excellent heat resistance.

In the ladder type organosiloxane resin of the above general formula [I] used in the present invention, when the side chain $R_1$ is a low-molecular-weight alkyl group such as a methyl group, the heating resistance of the resin is especially high, and when $R_1$ is a phenyl or halophenyl group, the heat resistance of the resin is relatively low. Specific examples of the side chain $R_1$ are as follows.

(1) phenyl
(2) phenyl+—$(CH_2)_2$·$CH(CH_3)_2$
(3) phenyl+—$(CH_2)_3$·$CH(CH_3)_2$
(4) phenyl+—$(CH_2)_5$·$CH_3$
(5) chlorophenyl
(6) methyl
(7) methyl+phenyl $R_2$, $R_3$, in the general formula [I] include, for example, hydroxy, methoxy, ethoxy, propoxy, methyl, ethyl and propyl groups, and $R_4$ and $R_5$ in the general formula [I] include, for example, hydrogen and methyl, ethyl and propyl groups.

The ladder type organosiloxane resin of the above formula [I] used in this invention has a weight average molecular weight ($\overline{Mw}$) of about 1,000 to about 1,000,000, preferably about 1,500 to about 200,000. The weight average molecular weight ($\overline{Mw}$) referred to in the instant specification and the appended claims is one determined from a calibration curve prepared according to gas permeation chromatography by using polystyrene as the reference sample. If the molecular weight is too low, the intended resist pattern can hardly be obtained. On the other hand, if the molecular weight is too high, the solubility in a solvent becomes poor and the processability of the resins is reduced.

It is preferred that the dispersivity (i.e., molecular distribution), defined as the ratio $\overline{Mw}/\overline{Mn}$ of the weight average molecular weight $\overline{Mw}$ to the number average molecular weight $\overline{Mn}$, of the ladder type organosiloxane resin of the above general formula [I] be small and as close to 1 as possible. Ordinarily, the ratio $\overline{Mw}/\overline{Mn}$ is in the range of from about 1.5 to about 4.

The ladder type organosiloxane resin of the above general formula [I] may be applied in the form of a solution onto a semiconductor device substrate having formed thereon a metal wiring layer. Solvents used for the preparation of the coating solution include, for example, aromatic and apliphatic hydrocarbons such as toluene and cyclohexane, cellosolves such as methyl cellosolve acetate, and alcohols and ketones. Although the suitable concentration of the organosiloxane resin in the coating solution varies depending upon the molecular weight of the organosiloxane, the solvent and the intended electronic device, the concentration of the organosiloxane resin is usually in the range of from 4 to 50% by weight. The coating may be conducted by spin coating and other conventional coating techniques.

The adhesion of the polyorganosilsesquioxane to a semiconductor device material is very good, and when the adhesion test was made on silicon (Si), silicon dioxide ($SiO_2$), phosphosilicate glass (PSG) and various electrode metals, it was found that the resin used in this invention has a good adhesion to each of these materials for electronic devices. Furthermore, when the resin was allowed to stand in steam maintained at 120° C. and 2 atmospheres for 50 hours, it was found that no degradation of the characteristics took place.

The results of specific examinations of the resist property, heat resistance and other characteristics of some ladder type organosiloxane resins used in this invention will now be described with reference to the following examples.

EXAMPLE 1

A resin composition (resist) was prepared by mixing 30 parts by volume of a polymethylsilsesquioxane of the above-mentioned structural formula [II] having a number average molecular weight $\overline{M}n$ of 24,500, a weight average molecular weight $\overline{M}w$ of 96,100 and a dispersivity $\overline{M}w/\overline{M}n$ of 3.9 with 70 parts by volume of a 1:1 volume ratio mixed solvent of isophorone and toluene. The resin composition was spin-coated on a silicon (Si) semiconductor substrate (wafer) at a thickness of 1.0 $\mu$m and then pre-baked in a nitrogen ($N_2$) atmosphere maintained at 100° C. for 1 hour. Then, the coated resin was irradiated an electron beam at an acceleration voltage of 10 KeV through a line pattern of a width of 2 $\mu$m having a line space of 2 $\mu$m, while varying the irradiation time, and the resin was then developed with xylene for 30 seconds and with methyl ethyl ketone for 1 minute.

The relation between the normalized film thickness and the electron beam irradiation dose at the above electron beam irradiation step is shown in the semi-logarithmic curve of FIG. 1. As is seen from curve A of FIG. 1, the electron beam irradiation dose necessary for obtaining a normalized film thickness of 0.5 is $1.7 \times 10^{-6}$ C/cm$^2$. Accordingly, it is apparent that the above resin composition functions sufficiently as a resist (negative type).

The irradiated resist film was post-baked in a nitrogen ($N_2$) atmosphere maintained at 120° C. for 30 minutes and was then heated in a nitrogen ($N_2$) atmosphere maintained at 450° C. for 1 hour. When it was examined by a scanning type electron microscope whether or not deformation of the pattern was caused by heating, no deformation was detected and it was confirmed that the resist film had an excellent heat resistance.

Figure 2:
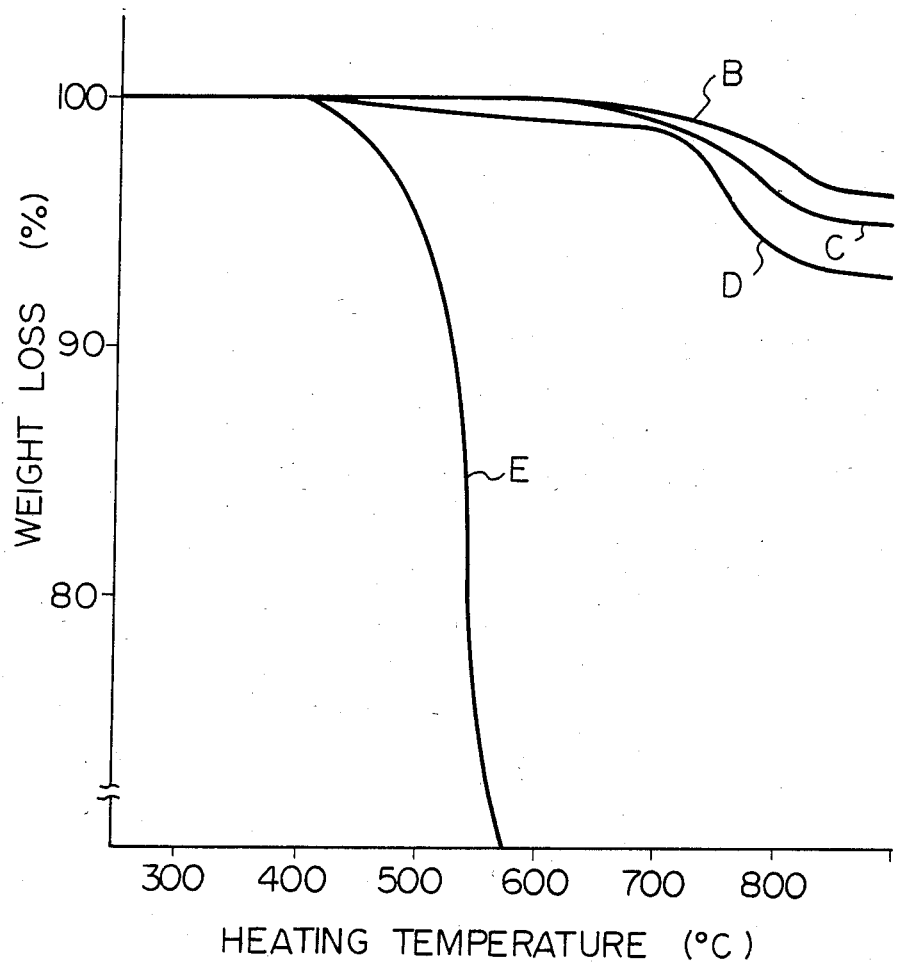
FIG. 2 is a curve comparing the results of the thermal test of the ladder type organosiloxane resin used in Example 2 with the results of a thermal test of a polyimide as a comparative resin.

In order to further confirm the heat resistance of the resin composition of this example, thermal analysis curves (weight loss curves) of the resin of this example and a comparative material (polyimide) were determined to obtain the results shown in FIG. 2. Curve B in FIG. 2 shows the results obtained in the resin of this example which had been cured in nitrogen at 450° C. for 1 hour, curve C in FIG. 2 shows the results of the resin of this example which had been cured in air at 450° C. for 1 hour, and curve D shows the, results obtained in the uncured resin of this example which had been pre-baked in nitrogen at 120° C. for 30 minutes. Curve E shows the results obtained in the comparative polyimide which had been cured in nitrogen. As is apparent from the results shown in FIG. 2, the weight loss in the resist of this example was much smaller than the weight loss in the comparative polyimide. Thus, it was confirmed that the resist of this example is excellent in heat resistance.

EXAMPLE 2

A resist was prepared by mixing 30 parts by volume of a polymethylsilsesquioxane of the above-mentioned structural formula [II] having a number average molecular weight $\overline{M}n$ of 24,500, a weight average molecular weight $/$ w of 96,100 and a dispersivity $\overline{M}w/\overline{M}n$ of 3.9 with 70 parts by volume of a 1:1 volume ratio mixed solvent of isophorone and toluene. The resist was spin-coated at a thickness of 1.0 $\mu$m on a silicon wafer and pre-baked in a nitrogen ($N_2$) atmosphere maintained at 100° C. for 1 hour. The resist was irradiated with proton (H+) rays at an acceleration voltage of 100 KeV by using a mask and a line pattern of a width of 2 $\mu$m having a line spacing of 2 $\mu$m, and was then developed by dipping it in xylene maintained at 20° C. for 30 seconds.

Figure 3:
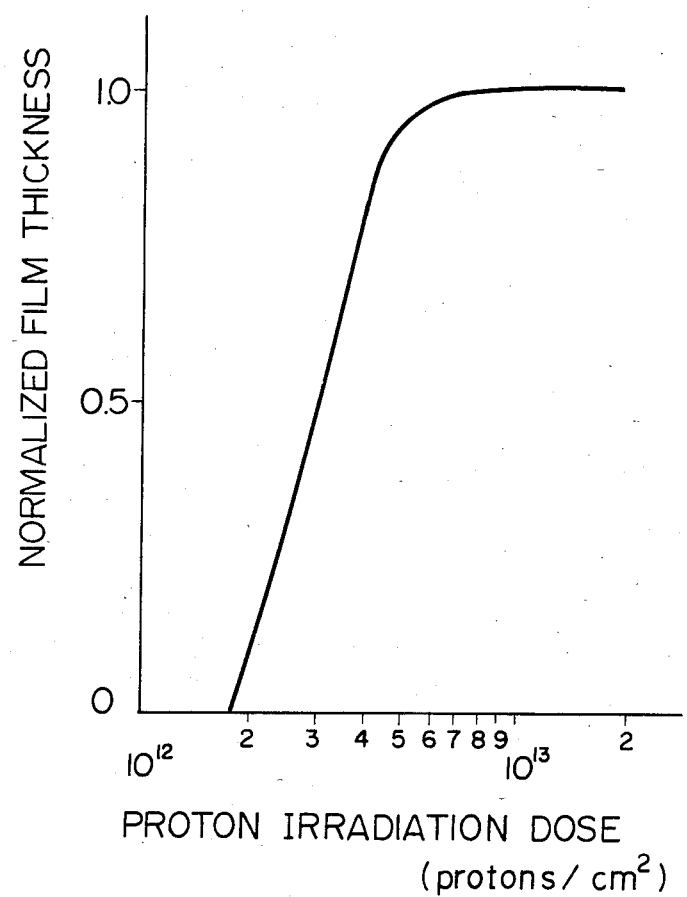
FIG. 3 is a curve illustrating the relation between the normalized thickness of the ladder type organosiloxane resin used in Example 2 and the irradiation dose of a proton beam.

The relation between the normalized film thickness and the proton irradiation dose is shown in the semi-logarithmic curve of FIG. 3. As is seen from the curve of FIG. 3, the proton irradiation dose necessary for formation of a normalized film thickness of 0.5 is $2.9 + 10^{12}$ protons/cm$^2$ ($4.6 \times 10^{-7}$ C/cm$^2$), and it was confirmed that the composition of this example can act sufficiently as a resist (negative type).

The irradiated resist film was post-baked in a nitrogen atmosphere maintained at 120° C. for 30 minutes and then heated in a nitrogen ($N_2$) atmosphere maintained at 450° C. for 1 hour. When it was examined by a scanning type electron microscope whether or not deformation by heating was caused in the sample, it was found that no deformation was caused. Accordingly, it was confirmed that the resist of this example was excellent in the heat resistance.

EXAMPLE 3

The same resist as prepared in Examples 1 and 2 was prepared, spin-coated at a thickness of 0.84 $\mu$m on a silicon (Si) wafer and pre-baked in a nitrogen ($N_2$) atmosphere maintained at 100° C. for 1 hour. Then, the resist was irradiated with X-rays having a wavelength of 8.34521 (X-ray source=Al-K$\alpha$, wavelength $\lambda=8.34\text{Å}$) by using a mask having a line pattern of a width of 2 $\mu$m and a line spacing of 2 $\mu$m and was developed by dipping it in methyl isobutyl ketone (MIBK) at 20° C. for 30 seconds.

Figure 4:
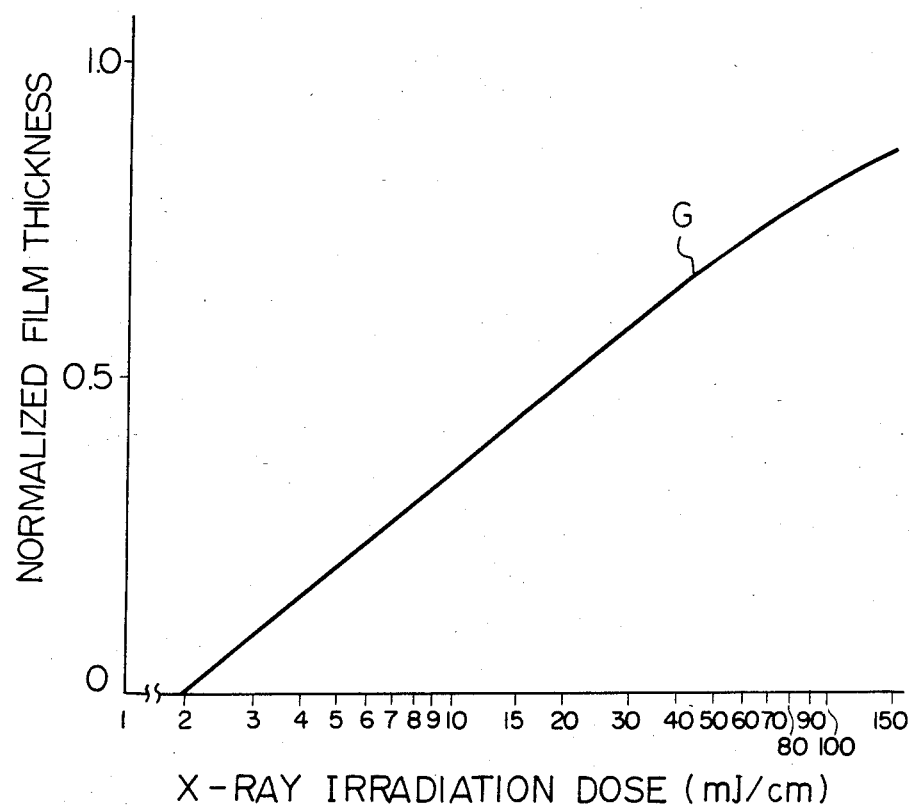
FIG. 4 is a curve illustrating the relation between the normalized thickness of the ladder type organosiloxane resin used in Example 3 and the irradiation dose of X-rays.

The relation between the normalized film thickness and the X-ray irradiation dose at the X-ray irradiation step is shown in the semi-logarithmic curve of FIG. 4. As is seen from curve G of FIG. 4, the X-ray irradiation dose necessary for obtaining a normalization film thickness of 0.5 is 20 mJ/cm$^2$, and it was confirmed that the composition of this example can sufficiently function as a resist (negative type).

The irradiated resist film was post-baked in a nitrogen (N$_2$) atmosphere maintained at 120° C. for 30 minutes and heated in a nitrogen (N$_2$) atmosphere maintained at 450° C. for 1 hour. When it was examined by a scanning type electron microscope whether or not deformation of the pattern was caused by heating, it was found that no deformation was caused, and it was confirmed that the resist of this example was excellent in heat resistance.

EXAMPLE 4

A resist was prepared by mixing 35 parts by volume of a polymethylphenylsilsesquioxane having a number average molecular weight $\overline{M}n$ of 1,360, a weight average molecular weight $\overline{M}w$ of 4,610 and a dispersivity $\overline{M}w/\overline{M}n$ of 3.4, which was represented by the above general formula [I] wherein $R_1$ was comprised of methyl (CH$_3$) and phenyl groups at a ratio of 2/1, $R_2$ and $R_3$ stood for an ethoxy group and $R_4$ and $R_5$ stood for an ethyl group, with 65 parts by volume of a 1:1 volume ratio mixed solvent of monobutylcellosolve acetate and toluene. The resist was spin-coated at a thickness of 1 μm on a silicon (Si) wafer and pre-baked in a nitrogen (N$_2$) atmosphere maintained at 80° C. for 30 minutes. Then, the resist was irradiated with an electron beam at an acceleration voltage of 30 kev, while changing the irradiation time, and the resist was then developed by dipping it in toluene maintained at 20° C. for 1 minute. The developed resist was promptly dried in a nitrogen (N$_2$) atmosphere. It was confirmed that a resolving power of 1 μm/1 μm was obtained at this step. Thus, it was found that the composition of this example can sufficiently function as a resist (negative type).

Figure 5:
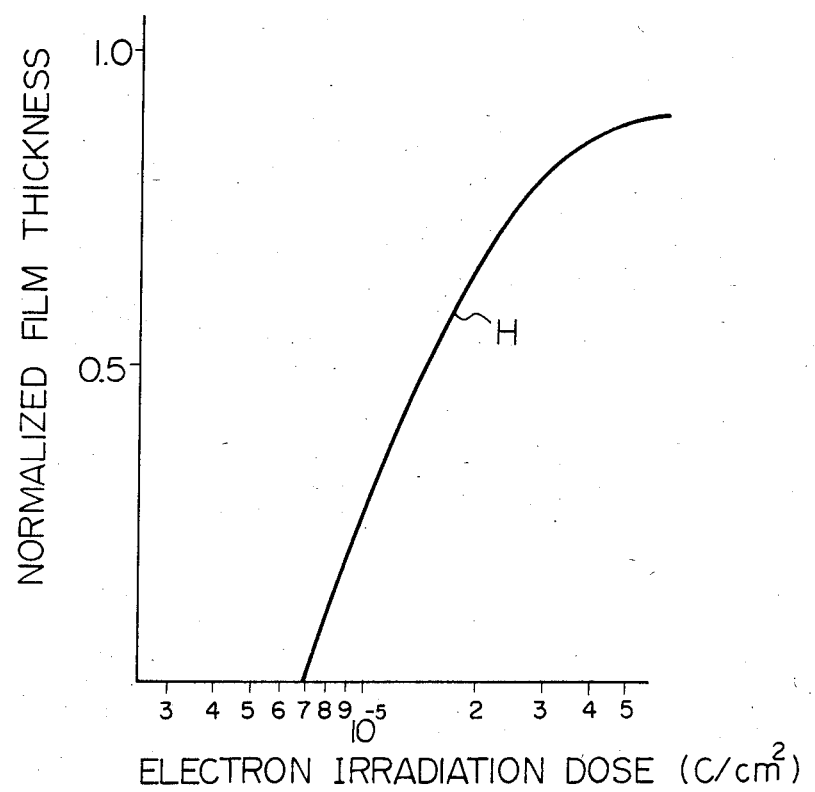
FIG. 5 is a curve illustrating the relation between the normalized thickness of the ladder type organosiloxane resin used in Example 4 and the irradiation dose of electron beam.

The above test was carried out in the same manner except that the initial resist film thickness was 1.1 μm, the electron acceleration voltage was 10 KeV and the development was carried out by dipping the resist in methyl isobutyl ketone at 20° C. for 30 seconds. The relation between the normalized film thickness and the electron beam irradiation dose at this step is shown in the semi-logarithmic curve of FIG. 5. As is apparent from curve H of FIG. 5, the electron beam irradiation dose necessary for obtaining a normalized film thickness of 0.5 is $1.5\times 10^{-15}$ C/cm$^2$. Thus, it was confirmed that the resist of this example can sufficiently function as a resist (negative type).

The irradiated resist film was post-baked in a nitrogen (N$_2$) atmosphere maintained at 120° C. for 30 minutes and then heated in a nitrogen (N$_2$) atmosphere maintained at 450° C. for 1 hour. When it was examined by a scanning type electron microscope whether or not deformation of the pattern was caused by heating, it was found that no deformation was caused at all, so that it was confirmed that the resist of this example had an excellent heat resistance.

EXAMPLE 5

A resist was prepared by mixing 35 parts by volume of a polyphenylsilsesquioxane having a number average molecular weight $\overline{M}n$ of 1,170, a weight average molecular weight $\overline{M}w$ of 2,100 and a dispersivity $\overline{M}w/\overline{M}n$ of 1.8, which was represented by the above general formula [I] wherein $R_1$ was a phenyl group, $R_2$ and $R_3$ stood for a hydroxyl group and $R_4$ and $R_5$ stood for hydrogen, with 65 parts by volume of methyl isobutyl ketone (MIBK). The so-formed resin composition was spin-coated in a thickness of 1 μm on a silicon (Si) wafer and the solvent was evaporated at 30° C. under a reduced pressure of about $6\times 10^{-3}$ Torr for 1 hour. The thickness of the film after drying was 0.95 μm. Then, the resist film was irradiated with ultraviolet rays emitted from a 500-W xenon-mercury lamp by using a mask having a line pattern of a width of 2 μm and a line spacing of 2 μm which were arranged with spaces of 2 μm while changing the irradiation time. The irradiated resist film was developed by dipping it in xylene maintained at 20° C. for 30 seconds. It was confirmed that a resolving power of 2 μm/2 μm was obtained at this step.

The relation between the normalized film thickness and the ultraviolet ray irradiation time at this step is shown in the semi-logarithmic curve of FIG. 6. From curve I of FIG. 6, it is seen that the ultraviolet ray irradiation time necessary for obtaining a normalization film thickness of 0.5 is 1,900 seconds, and it was confirmed that the resist can sufficiently function as a resist (negative type).

Then, the irradiated resist film was post-baked in a nitrogen (N$_2$) atmosphere maintained at 120° C. for 30 minutes and then heated in a nitrogen (N$_2$) atmosphere maintained at 450° C. for 1 hour. When it was examined by a scanning type electron microscope whether or not deformation of the pattern by heating was caused in the sample, it was found that no deformation was caused. Accordingly, it was confirmed that the resist of this example was excellent in heat resistance. Incidentally, if the weight average molecular weight was doubled in this example, it was found that the necessary ultraviolet ray irradiation time was reduced to about ½.

EXAMPLE 6

In this example, the process comprising forming a resist pattern of a ladder type organosiloxane resin represented by the above general formula [I] and fabricating a semiconductor device by using this resist pattern as an insulating layer will be described with reference to FIGS. 7A through 7F.

Figure 7A:
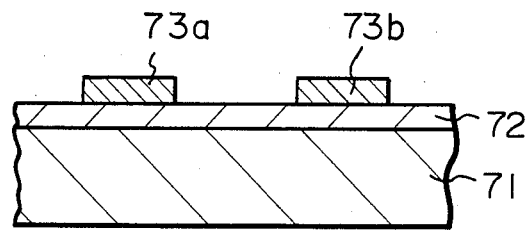
FIGS. 7A through 7F are sectional views illustrating the steps of one embodiment of the process for producing a semiconductor device by utilizing a ladder type organosiloxane resin according to this invention.

In FIG. 7A, reference numeral 71 represents a silicon (Si) substrate including active elements such as transistors (not shown) and/or passive elements such as resistors and capacitors (not shown).

In the case where the intended semiconductor device is a bipolar type semiconductor integrated circuit device, the semiconductor substrate ordinarily comprises a p-type silicon substrate and an n-type silicon epitaxial layer formed on the p-type silicon substrate.

Such a bipolar type semiconductor integrated circuit device is prepared according to a conventional method. More specifically, a donor impurity such as arsenic (As) or antimony (Sb) is selectively doped at a high concentration to the surface of the p-type silicon substrate to form an n$^+$-type doped layer. This selective doping of the donor impurity can be accomplished by a customary selective diffusion or ion implantation method. Then, an n-type silicon epitaxial layer is formed on the p-type silicon substrate including the above-mentioned n$^+$-type doped layer formed thereon. This n-type epitaxial layer can be formed, for example, by the gas phase epitaxial growth process in which a phosphorus (P) compound such as phosphine (PH$_3$) and a silicon compound such as monosilane (SiH$_4$) are thermally decomposed.

An acceptor impurity such as boron (B) is selectively doped from the surface of the n-type silicon epitaxial layer along a depth reaching the p-type silicon substrate to form a p-type isolation region. By formation of such isolation region, the epitaxial layer is divided in respective element-forming regions. The isolation region may also be formed from an insulating material such as a silicon dioxide film instead of doping of the acceptor impurity.

Then, an acceptor impurity is selectively doped from the surface of the n-type silicon epitaxial layer to form a p-type base region and/or a p-type resistor region. Boron (B) is usually employed as the acceptor impurity, and the acceptor impurity can be doped according to the selective diffusion or ion implantation method. When this acceptor impurity is doped, the silicon dioxide film on the surface of the n-type epitaxial layer is used as a mask.

Then, a donor impurity is selectively doped at a high concentration into the p-type base region to form an $n^+$-type emitter region, and simultaneously, this donor impurity is doped also in the surface of the n-type epitaxial layer outside the p-type base region to form an $n^+$-type collector contact region. Arsenic (As) or phosphorus (P) is ordinarily used as the donor impurity. The doping is accomplished by the selective diffusion or ion implantation method. Also, for doping of this donor impurity, the silicon dioxide film formed on the surface of the n-type epitaxial layer is used as a mask.

Then, electrode-connecting holes are formed on the silicon dioxide film on the surface of the n-type epitaxial layer.

Reference numeral 72 represents a silicon dioxide ($SiO_2$) layer having a thickness of about 6000Å formed on the surface of the silicon substrate by the thermal oxidation method or chemical vapor deposition method (CVD method), and reference numerals 73a and 73b represent a lower (first) electrode wiring layer of aluminum (Al) having a thickness of 1.0 μm, which is selectively disposed on the silicon dioxide ($SiO_2$) layer 72. This electrode wiring layer 73 is formed by vacuum deposition of aluminum (Al) and subsequent photo-etching. The aluminum electrode wiring layer 73 is connected to the desired regions of elements formed on the semiconductor layer or semiconductor substrate in the above-mentioned electrode-connecting windows (not shown) formed on the above-mentioned silicon dioxide layer 72. Incidentally, aluminum for the wiring layer may contain silicon (Si) in an amount of up to several percent. The vacuum-deposited aluminum layer is patterned by plasma etching using a positive type photo-resist, for example, OFPR manufactured and supplied by Tokyo Ohka K.K., as a mask and carbon tetrachloride ($CCl_4$) as an etchant gas. An ordinary parallel plate type plasma etching device may be used for this plasma etching treatment.

According to this invention, a layer 74 of a resin composition comprising a polymethylsilsesquioxane of this invention is formed in a thickness of about 0.8 μm to cover the exposed surface of the silicon dioxide ($SiO_2$) layer 72 and the lower wiring layer 73. The resin composition layer 74 comprises a polymethylsilsesquioxane resin having, for example, a weight average molecular weight $\overline{M}w$ of 59,800, a number average molecular weight $\overline{M}n$ of 34,100 and a dispersivity $\overline{M}w/\overline{M}n$ of 1.75, and this layer 74 is formed by spin-coating the above resin composition at a rotation rate of 3,000 rpm to cover the exposed surface of the silicon dioxide ($SiO_2$) layer 72 and the lower wiring layer 73. Then, the resin composition layer 74 is heat-treated in a nitrogen ($N_2$) atmosphere at about 150° C. for about 15 minutes.

Figure 7B:
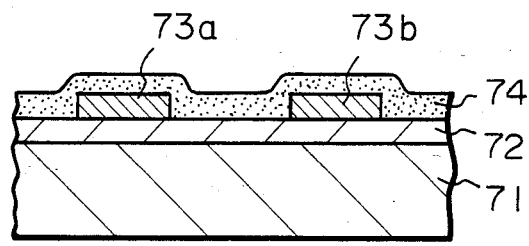

The state of forming this resin composition layer 74 is shown in FIG. 7B.

Then, the resin composition layer 74 is selectively irradiated with electron beams to effect the exposure treatment. The electron beam irradiation is carried out, for example, at an acceleration voltage of 20 KeV in an electron beam dose of $6 \times 10^{-6}$ C/cm$^2$.

Figure 7C:
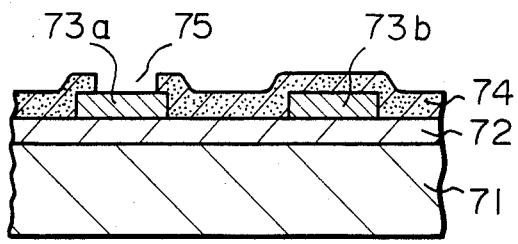

The irradiated resin composition layer 74 is dipped in xylene for 30 seconds and then in methyl ethyl ketone for 60 seconds to effect the development treatment, whereby holes 75 (layer-connecting via holes) are formed in the resin composition resin layer 74. This state is illustrated in FIG. 7C.

According to this invention, the semiconductor substrate comprising the above-mentioned resin composition layer 74 is heat-treated in a nitrogen ($N_2$) atmosphere at 450° C. for about 60 minutes to improve the compactness and heat resistance of the resin composition layer 74.

Figure 7D:
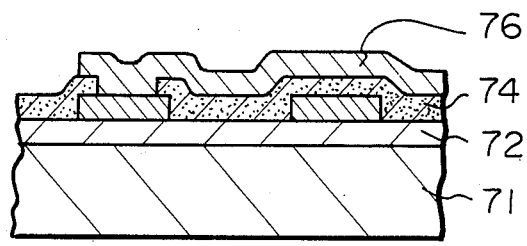

Then, an upper (second) wiring layer 76 is formed at a thickness of about 1.5 μm to cover the surface of the resin composition layer 74 and the exposed surface of the electrode wiring layer 73a. This wiring layer 76 is formed by vacuum deposition of aluminum (Al) and subsequent photo-etching, as well as the above-mentioned lower (first) wiring layer 73. This state is illustrated in FIG. 7D.

Figure 7E:
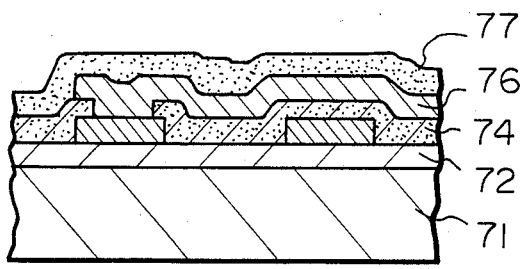

Then, a layer 77 of a resin composition comprising a polymethylsilsesquioxane of this invention is formed at a thickness of about 1.5 μm to cover the exposed portion of the above-mentioned first resin composition layer 74 and the upper wiring layer 76. The polymethylsilsesquioxane resin constituting this resin composition layer has a weight average molecular weight $\overline{M}w$ of 59,800, a number average molecular weight $\overline{M}n$ of 34,100 and a dispersivity $\overline{M}w/\overline{M}n$ of 1.75, as well as the resin used for the resin composition layer 74. The resin composition is spin-coated to cover the exposed portion of the resin composition layer 74 and the upper wiring layer 76. Then, the resin composition layer 77 is heat-treated in a nitrogen ($N_2$) atmosphere at about 150° C. for about 15 minutes. The state of forming this resin composition layer 77 is illustrated in FIG. 7E.

Figure 7F:
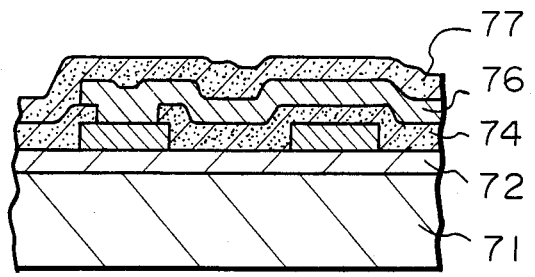

According to the present invention, the resin composition layer 77 is selectively irradiated with electron beams to effect the exposure treatment, and the resin composition layer 77 is then subjected to the development treatment to form holes on the wiring layer and bonding pad portions. This state is illustrated in FIG. 7F.

The conditions adopted for the electron beam irradiation treatment and development treatment of the resin composition layer 77 are the same as those adopted for the above-mentioned resin composition layer 74.

Then, the semiconductor substrate comprising the so-formed resin composition layer 77 is heat-treated in a nitrogen ($N_2$) atmosphere at 450° C. for about 60 minutes to improve the compactness and heat resistance of the resin composition layer 77.

In the so-fabricated semiconductor device, the resin composition layer 74 is used as the interlaminar insulating layer and the resin composition layer 77 is used as the surface protecting layer or passivating layer.

Figure 8:
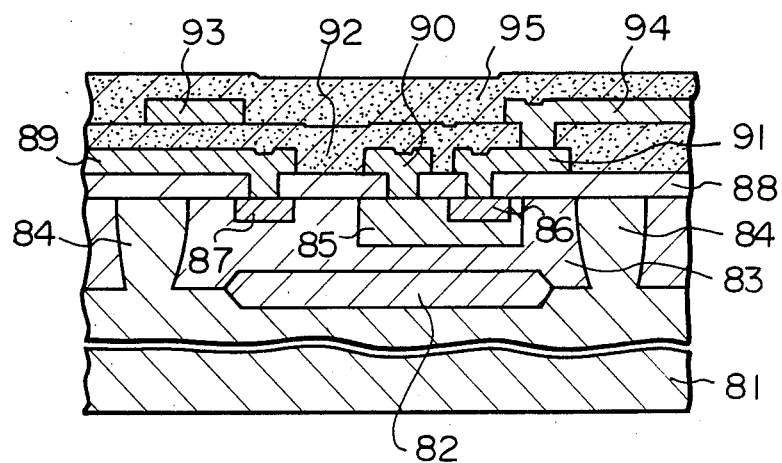
FIG. 8 is a sectional view illustrating a semiconductor device (bipolar type semiconductor integrated circuit device) prepared through the steps shown in FIGS. 7A through 7F.

FIG. 8 is a sectional partial view illustrating the bipolar type semiconductor integrated circuit device prepared through the steps illustrated in FIGS. 7A through 7F.

In FIG. 8, reference numerals 81, 82, 83, 84, 85, 86, 87, 88, 89, 90 and 91 represent a p-type silicon substrate, an n+-type buried layer, an n-type silicon epitaxial layer, a p-type isolation region, a p-type base region, an n+-type emitter region, and n+-type collector contact region, a silicon dioxide layer, a collector electrode, a base electrode and an emitter electrode, respectively. Furthermore, reference numeral 92 represents an interlaminar insulating layer composed of the resin composition of the present invention, and reference numeral 95 represents a surface protecting insulating layer composed of the resin composition of the present invention, while reference numerals 93 and 94 represent an upper wiring layer.

In the above-mentioned preparation process, each resin composition layer is distinguishable over a conventional insulating layer such as a silicon dioxide (SiO₂) film in that photo-resists need not be used independently for the respective layers. Accordingly, the step of patterning the resin composition layers can be remarkably simplified, and this simplification of the preparation process results in a great improvement of the manufacturing yield of the semiconductor device.

The preparation process shown in FIG. 7 may be modified as follows.

More specifically, at the step shown in FIG. 7C, after the heat treatment of the resin composition layer 74, an aluminum (Al) layer 76 is formed on the entire surface and then, a second resin composition layer is formed on the aluminum (Al) layer 76. Then, the second resin layer is subjected to the exposure and development treatment and optionally to the heat treatment, and the aluminum (Al) layer 76 is selectively etched by using the second resin layer as a mask to form an upper wiring layer. Then, a surface protecting layer composed of phosphosilicate glass (PSG) or the resin composition of this invention is formed on the entire surface.

By the above-mentioned irradiation treatment and subsequent heat treatment of the resin composition layers 74 and 77, these resin layers come to have such electric characteristics as a resistivity of about $10^{15}$ Ω-cm, a dielectric strength of $1.0 \times 10^6$ V/cm, a surface potential of about $10^{10}$ cm$^{-2}$ and a dielectric and a constant of 2.5 to 3.5.

Figure 9:
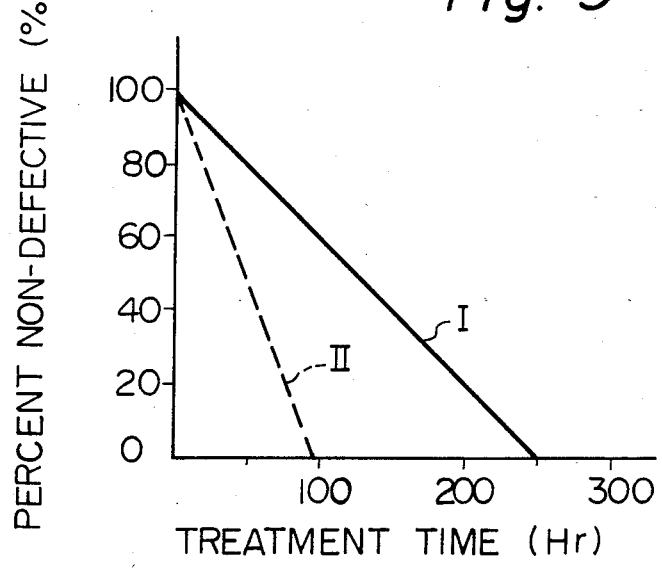
FIG. 9 is a graph illustrating the results of the pressure cooker test (PCT) made on the bipolar semiconductor integrated circuit device shown in FIG. 8.

When a semiconductor device having a structure shown in FIG. 8 was subjected to the pressure cooker test (PCT), the results [percent non-defective (%) vs. treatment time] shown in FIG. 9 were obtained. Incidentally, the test was conducted in a hydrogen-containing atmosphere at a temperature of 121° C. and a pressure of 2 atmospheres.

In FIG. 9, line I indicates the relation between the treatment time and the non-defective percentage in the case of the semiconductor device which has as a final protecting layer the resin composition layer of this invention, and line II indicates the same relation in the case of the semiconductor device which has as a final protecting layer a conventional phosphosilicate glass layer (phosphorus content=7 to 8%, thickness=1.5 μm).

From the results of this PCT and the above-mentioned electric characteristics, it will readily be understood that the organosiloxane resin composition of this invention can be used as the interlaminar insulating and the surface protecting or passivating insulating layers of a semiconductor device.

When the organosiloxane resin composition is used as an interlaminer insulating layer, it is preferable that the layer has a thickness of from 0.8 to 2.0 μm. When the organosiloxane resin composition is used as a surface protecting insulating layer, it is preferable that the layer has a thickness of from 1.0 to 4.0 μm.

As will be apparent from the foregoing description, after the organosiloxane resin of this invention has functioned as a lithographic resist, it can be used as an insulating layer as it is without removal or after it is subjected to a simple heat treatment at a low temperature, because it is excellent in heat resistance. Therefore, if the patterning method of this invention using this organosiloxane resin is utilized for the manufacture of semiconductor devices, the manufacturing process can be simplified. Furthermore, since coating of the organosiloxane resin as the resist is accomplished by spin coating, the resulting resist layer is excellently even, so that when an electrode metal or the like is vacuum-deposited on the resist layer the risk of breaking the wiring layer is remarkably reduced and reliability is highly improved.

In Example 6, the fabrication of a bipolar type semiconductor integrated circuit element has been illustrated with reference to FIGS. 7A through 7B. It is to be understood, however, that the present invention is not limited thereto but can be applied to the fabrication of discrete semiconductor elements as well as MIS (metal insulator semiconductor) type semiconductor integrated circuit elements.

We claim:
1. A process comprising the steps of:
coating a substrate with a ladder-type organosiloxane resin represented by the general formula:

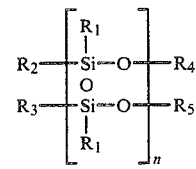

wherein: each R₁ is independently selected from alkyl groups having 1 to 6 carbon atoms, and phenyl and halophenyl groups; R₂ and R₃ are independently selected from alkoxy groups having 1 to 3 carbon atoms, a hydroxyl group and alkyl groups having 1 to 3 carbon atoms; R₄ and R₅ are independently selected from hydrogen and alkyl groups having 1 to 3 carbon atoms; and n is a number giving a weight average molecular weight of about 1,000 to 1,000,000 to the ladder-type organosiloxane resin, said ladder-type organosiloxane resin having a dispersivity of from about 1.5 to about 4;
directly irradiating the coated organosiloxane resin with energy rays according to a desired pattern;
subjecting the irradiated coated organosiloxane resin to a development treatment to remove the non-irradiated portion of the resin to form a mask of said ladder-type resin with said desired pattern;
after forming said mask, heating said mask at a temperature of from 200° to 500° C. in an inert gas atmosphere, wherein said mask after said heating comprises said ladder-type resin;
using said mask to etch a respective exposed part of said substrate;
leaving at least a portion of said mask permanently on said substrate as an insulating layer; and heating said portion of said mask remaining as said insulating layer to a temperature of at least 450° C.; wherein said insulating layer after said heating, has said ladder-type structure and is provided with a low weight loss characteristic for a temperature of up to approximately 700° C.

2. A process comprising the steps of:

forming a layer on a substrate having a lower wiring layer of a ladder-type organosiloxane resin represented by the general formula:

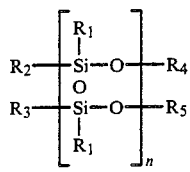

wherein: each $R_1$ is independently selected from alkyl groups having 1 to 6 carbon atoms, and phenyl and halophenyl groups; each $R_2$, $R_3$, $R_4$, and $R_5$ is independently selected from hydrogen, alkoxy groups having 1 to 3 carbon atoms, a hydroxyl group and alkyl groups having 1 to 3 carbon atoms; and n is a number giving a weight average molecular weight of about 1,000 to about 1,000,000 to the ladder-type resin, said ladder-type organosiloxane resin having a dispersivity of from about 1.5 to about 4;

directly subjecting the resin layer to selective irradiation with energy rays and to a subsequent development treatment to remove the non-irradiated portion of the resin layer, so as to form through-holes in the resin layer for contacting said lower wiring layer;

forming an upper wiring layer having portions connecting to the lower wiring layer via said through-holes and extending on the surface of the remaining portion of the resin layer;

heating the remaining portion of the resin layer to a temperature of at least 450° C.; and wherein the remaining portion of the resin layer has said ladder-type structure of the organosiloxane resin, and is provided with a low weight loss characteristic for a temperature of up to approximately 700° C.

3. A process according to claim 1 or 2 wherein n in said general formula is a number giving a weight average molecular weight of about 1,500 to about 200,000 to the ladder type organosiloxane resin.

4. A process according to claim 1 or 2 wherein $R_1$ in said general formula is selected from the group consisting of methyl and phenyl groups.

5. A process according to claim 1 or 2 wherein the ladder-type organosiloxane resin is used in the form of a solution of a 4 to 50% by weight concentration in at least one solvent selected from the group consisting of hydrocarbons, cellosolves, alcohols and ketones.

6. A process according to claim 1 or 2 wherein, prior to the irradiation with energy rays, the organosiloxane resin layer is pre-baked in an inert gas atmosphere at a temperature of from 50° to 200° C. for 30 minutes to 2 hours.

7. A process according to claim 2, wherein said layer of the ladder-type organosiloxane resin has a thickness of from 0.8 to 2.0 μm.

8. A process according to claim 2, wherein another layer of a ladder-type organosiloxane resin represented by said general formula is formed as a surface protecting insulating layer on the upper wiring layer.

9. A process according to claim 8, wherein said surface protecting insulating layer has a thickness in the range from 1.0 to 4.0 μm.

10. A process according to claim 1 or 2, wherein said energy rays are light rays.

11. A process according to claim 1 or 2, wherein said energy rays are X-rays.

12. A process according to claim 1 or 2, wherein said energy rays are light rays.

13. A process according to claim 1 or 2, wherein said energy rays are ion beams.

14. The process of claim 1, wherein said portion of the mask remaining as said insulating layer is provided with a thickness in the range from 0.8 to 2.0 micron.

15. The process of claim 2, wherein a further layer of said ladder-type organosiloxane resin is formed according to said forming step to provide a surface protecting insulating layer with a thickness in the range of 1.0 to 4.0 microns.

* * * * *

UNITED STATES PATENT AND TRADEMARK OFFICE
CERTIFICATE OF CORRECTION

PATENT NO. : 4,600,685　　　　　　　　　　　　　　　Page 1 of 2

DATED : 15 July 1986

INVENTOR(S) : TOSHISUKE KITAKOHJI et al

It is certified that error appears in the above-identified patent and that said Letters Patent is hereby corrected as shown below:

Front Page [57] Reference Cited, line 2, "4,041,190 3/1977 Debois" should be --4,041,190 8/1977 Dubois--;

Col. 2, line 2, "Debois" should be --Dubois--;

after line 7, insert the following --Attorney, Agent, or Firm - Staas & Halsey--.

Col. 1, line 14 "organo-siloxane" should be --organosiloxane--.

Col. 2, line 16, "futher" should be --further--.

Col. 4, line 21, "polymethyl-silsesquioxane" should be --polymethylsilsesquioxane--.

Col. 6, line 4, "the," should be --the--;
line 21, "/ w" should be -- $\overline{M}w$ --;
line 28, "and" should be --having--;
line 29, "having" should be --and--;
line 37, "2.9+" should be --2.9 x --;

line 56, "8.34521" should be --8.34 Å--;

line 56, delete ", wavelength = 8.34Å)".

UNITED STATES PATENT AND TRADEMARK OFFICE
CERTIFICATE OF CORRECTION

PATENT NO. : 4,600,685

DATED : 15 July 1986

INVENTOR(S) : TOSHISUKE KITAKOHJI et al.

Page 2 of 2

It is certified that error appears in the above-identified patent and that said Letters Patent is hereby corrected as shown below:

Column 7, line 26, "kev," should be -- KeV --.

Signed and Sealed this

Twenty-eighth Day of October, 1986

[SEAL]

Attest:

Attesting Officer

DONALD J. QUIGG

Commissioner of Patents and Trademarks